(12) United States Patent
Kadoko et al.

(10) Patent No.: US 11,259,429 B2
(45) Date of Patent: Feb. 22, 2022

(54) ELECTRICAL FLOOR BOX COVER

(71) Applicant: ABB Schweiz AG, Baden (CH)

(72) Inventors: Jonah Kadoko, Mint Hill, NC (US); Charles C. Britton, Germantown, TN (US); Michael D. Martin, Rochester, NY (US)

(73) Assignee: ABB SCHWEIZ AG, Baden (CH)

( * ) Notice: Subject to any disclaimer, the term of this patent is extended or adjusted under 35 U.S.C. 154(b) by 0 days.

(21) Appl. No.: 16/923,800

(22) Filed: Jul. 8, 2020

(65) Prior Publication Data
US 2022/0015252 A1  Jan. 13, 2022

(51) Int. Cl.
*H02G 3/14* (2006.01)
*H05K 5/03* (2006.01)
*H02G 3/18* (2006.01)

(52) U.S. Cl.
CPC .............. *H05K 5/03* (2013.01); *H02G 3/14* (2013.01); *H02G 3/185* (2013.01)

(58) Field of Classification Search
CPC ............ H02G 3/08; H02G 3/081; H02G 3/12; H02G 3/14; H02G 3/083; H02G 3/121; H02G 3/123; H02G 3/185; H02G 3/02; H02G 3/088; H02G 3/22; H02G 3/283; H02G 3/383; H05K 5/03; H05K 5/00; H05K 5/02; H01R 13/447; H01R 13/453; H01R 13/4532; H01R 13/4534; H01R 13/4536; H01R 13/4538

USPC ... 174/50, 53, 57, 58, 66, 67, 481–490, 520; 439/535, 536, 136, 135, 538; 312/30, 312/223.3, 293.2, 593.3, 594, 322, 325
See application file for complete search history.

(56) References Cited

U.S. PATENT DOCUMENTS

| | | | | |
|---|---|---|---|---|
| 7,319,193 | B2 * | 1/2008 | Halterman | H02G 3/185 174/482 |
| 8,119,912 | B2 * | 2/2012 | Thibault | H02G 3/18 174/67 |
| 8,357,852 | B2 * | 1/2013 | Drane | H05K 5/03 174/66 |
| 8,921,695 | B2 | 12/2014 | Drane | |
| 9,148,007 | B2 * | 9/2015 | Drane | H02G 3/185 |
| 9,705,298 | B2 * | 7/2017 | Dinh | H02G 3/14 |
| 9,831,648 | B1 * | 11/2017 | Gretz | H02G 3/185 |
| 10,770,875 | B2 * | 9/2020 | Byrne | H02G 3/185 |

* cited by examiner

*Primary Examiner* — Angel R Estrada
(74) *Attorney, Agent, or Firm* — Greenberg Traurig, LLP

(57) ABSTRACT

A floor cover assembly for a floor box assembly that includes a lid and a base ring. The base ring can have a slotted portion that is sized to accommodate at least partial slideable displacement of the lid, and which includes an opening that extends through the base ring. The lid or the base ring can include a plurality of locking tabs, and the other of the lid and the base ring can include a plurality of lock grooves. The locking tabs can each comprise an overhang that are sized to be received in an open end of a mating lock groove. The lock grooves can be shaped to accommodate displacement of the plurality of locking tabs within the mating lock groove, such as in connection with a slide-and-lock attachment. The lid can also be manufactured to include a lid cover having a three-dimensional image.

17 Claims, 8 Drawing Sheets

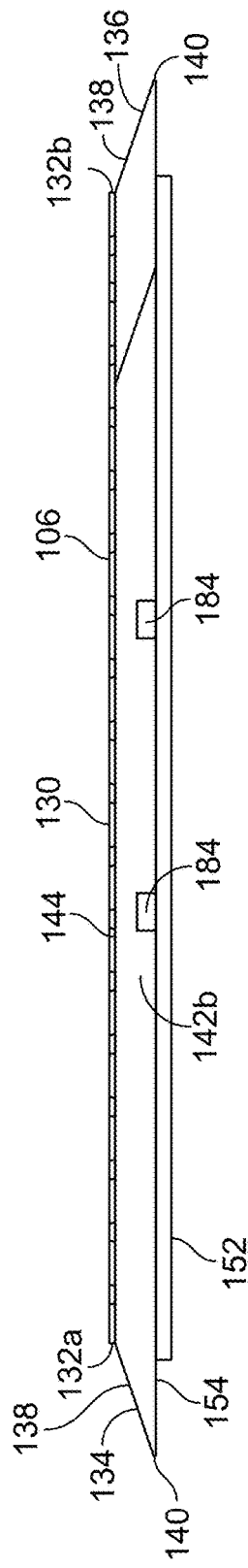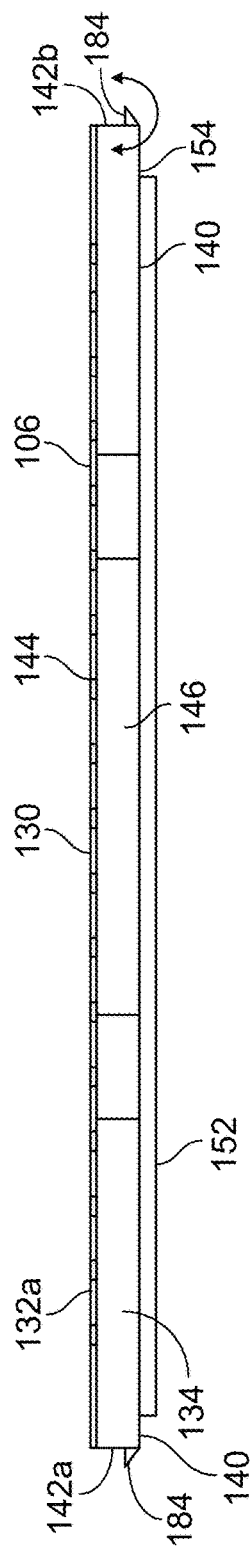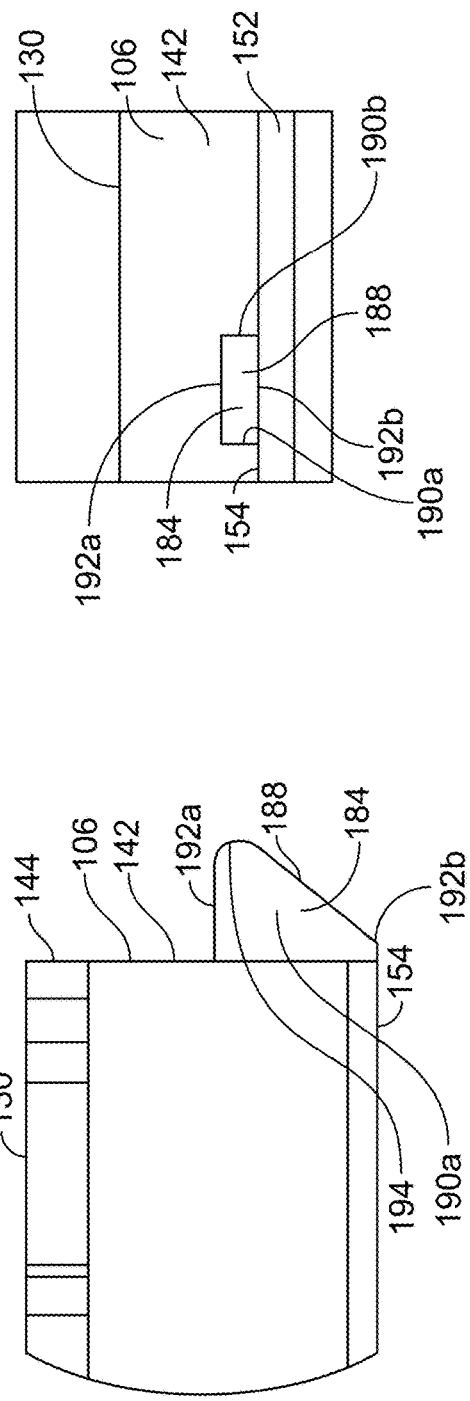

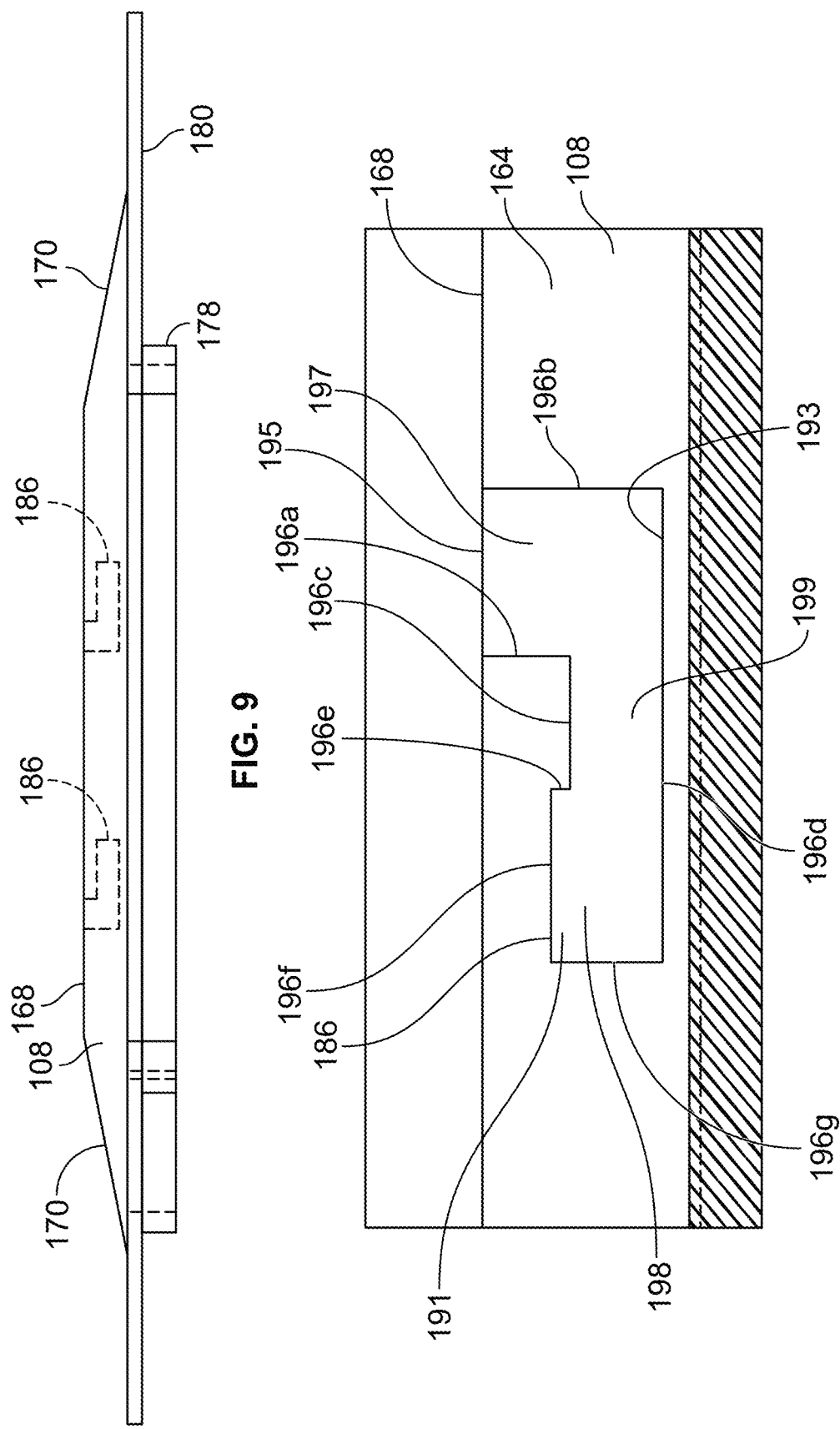

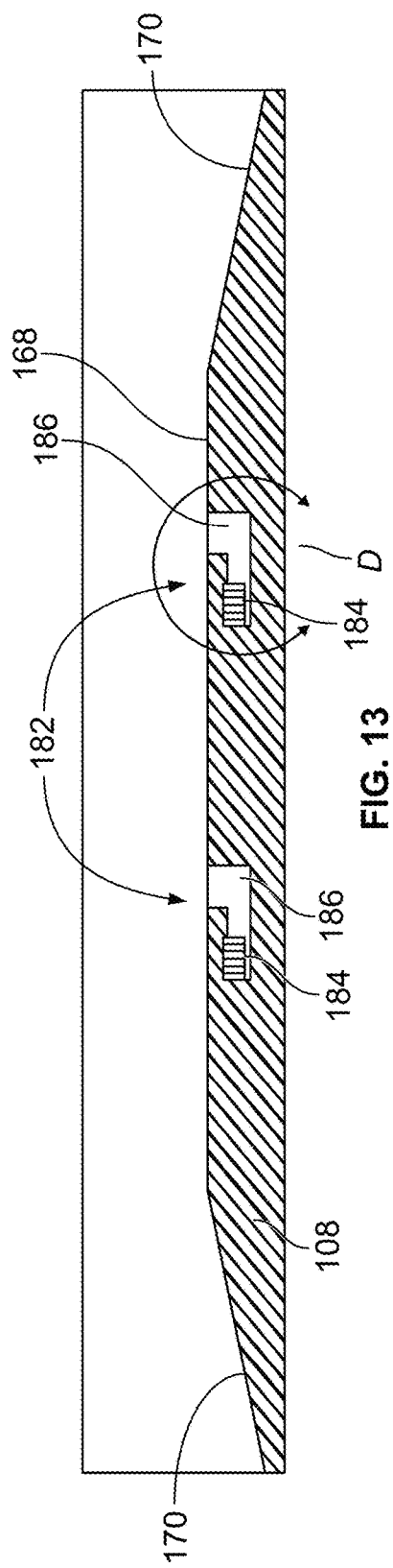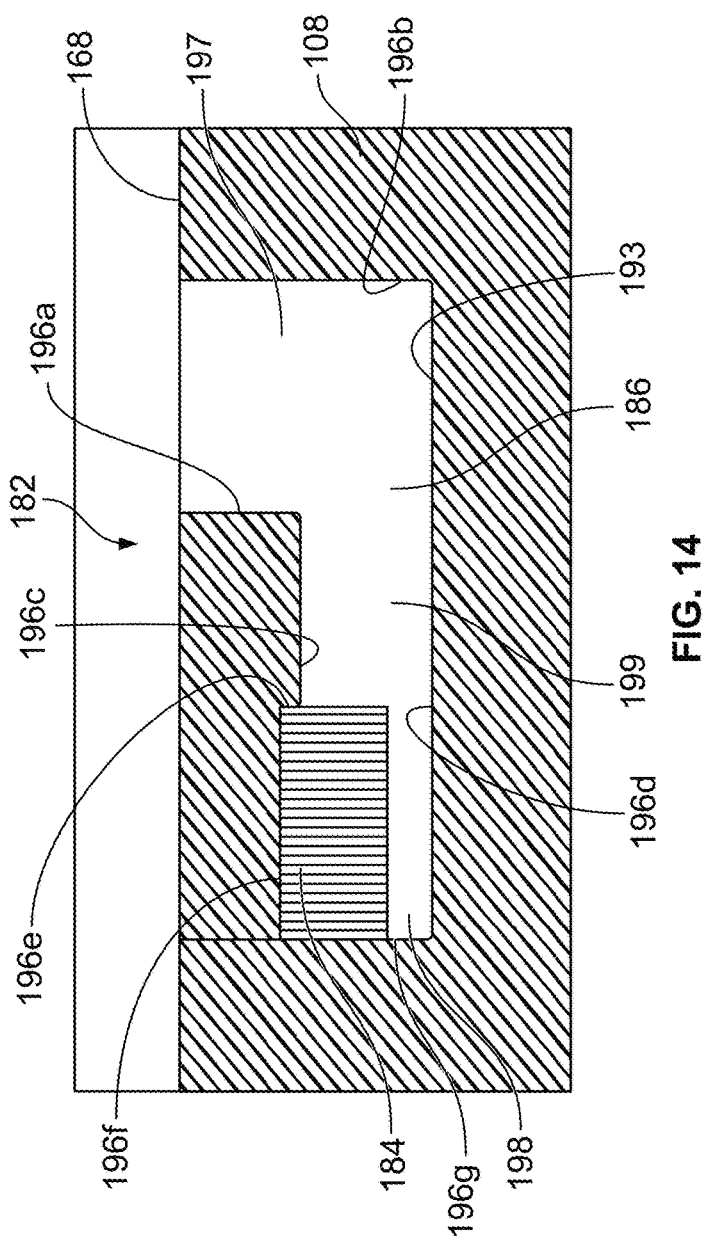

ELECTRICAL FLOOR BOX COVER

FIELD OF INVENTION

The present invention relates to electrical floor boxes, and more particularly, to floor covers for electrical floor boxes.

BACKGROUND

Floor covers for electrical floor boxes that are used with electrical devices, and/or electrical wiring associated with electrical devices, often comprise multiple die-casted parts. Yet, the relatively high number of different parts of traditional floor covers can often result in relatively high labor costs in the production and assembly of floor covers.

Additionally, relatively high tooling costs for die-casting often precludes customization of floor covers. Thus, die casting can be cost prohibitive for customers seeking floor covers that, in addition to meeting basic function geometry, such as Underwriters Laboratory (UL) listed and tested geometries, also satisfy personalized architectural styles and functional patterns. Further, batch processes such as die-casting typically involve relatively long setup times, thereby rendering low-volume production costly. Additionally, die casting may not be able to accommodate the manufacturing of certain design features, such as, for example, overhangs.

Accordingly, although various floor covers are available currently in the marketplace, further improvements are possible to provide floor covers having a lesser number of components that are also suitable for low-volume production using economically feasible manufacturing processes.

BRIEF SUMMARY

An aspect of an embodiment of the present application is an apparatus comprising a lid and a base ring, the base ring having a pair of sidewalls and an upper slotted wall that define at least a portion of a slotted portion of the base ring. The lid can be sized for at least partial slideable displacement within the slotted portion of the base ring. Further, a portion of the upper slotted wall can include an opening that extends through the base ring. The lid or the base ring can include a plurality of locking tabs, and the other of the lid and the base ring can include a plurality of lock grooves. The plurality of locking tabs can each comprise an overhang that is sized to be received in an open end of a mating lock groove of the plurality of lock grooves. The plurality of lock grooves can be shaped to accommodate displacement of the plurality of locking tabs within the mating lock groove in at least two different directions from the open end to a locked position within the mating lock groove.

Another aspect of an embodiment of the present application is an apparatus comprising a lid having a first sidewall and a second sidewall that extend between opposing outer edges of the lid. At least one locking tab can outwardly project from each of the first and second sidewalls of the lid. The lid can further include a slot that extends from a front edge portion of the outer edges of the lid and into a lid cover of the lid, the slot providing an open area through the lid. The apparatus can also include a base ring having a first sidewall, a second sidewall, and an upper slot wall that define at least a portion of a slotted portion of the base ring. The slotted portion can be sized to receive placement of the lid. A portion of the upper slotted wall can include an opening that extends through the base ring, at least one lock groove being positioned in each of the first and second sidewalls of the base ring. The at least one lock groove can have an open end sized to receive insertion of the at least one locking tab. The at least one lock groove can be shaped to accommodate displacement of the at least one locking tab within the at least one lock groove in at least three different directions from the open end to a locked position within the at least one lock groove. The apparatus can also include a gasket that can be configured to provide a seal between at least a portion of the lid and at least a portion of the base ring at least when the at least one locking tab is at the locked position within the at least one lock groove.

Additionally, an aspect of an embodiment of the present application is a method of manufacturing at least a lid cover for the lid that includes obtaining an image in an electronic file and digitally transforming, if the image in the electronic file is a two-dimensional image, the two-dimensional image into a three-dimensional image. The three-dimensional image can be confirmed to one or more geometric features of the lid cover to provide an assembly file. The process can also include manufacturing the lid cover using the assembly file to produce the lid cover with a three-dimensional representation of the three-dimensional image.

These and other aspects of the present invention will be better understood in view of the drawings and following detailed description.

BRIEF DESCRIPTION OF THE DRAWINGS

The description herein makes reference to the accompanying figures wherein like reference numerals refer to like parts throughout the several views.

FIGS. 3 and 4 illustrate side and front views of the lid shown in FIG. 2.

FIG. 5 illustrates a portion of the lid taken from section A from FIG. 4.

FIG. 6 illustrates a side view of an overhang body of the lid from FIG. 3 and in which the lid includes a gasket.

FIGS. 8 and 9 illustrate rear and side views of the ring base shown in FIG. 7.

FIG. 10 illustrates a lock groove of the ring base shown in FIG. 7.

FIG. 13 illustrates a cross sectional view of a portion of the floor cover assembly taken along line C-C in FIG. 7.

FIG. 14 illustrates an enlarged view of a latch system of the floor cover assembly taken from section D in FIG. 13.

Figure 1:
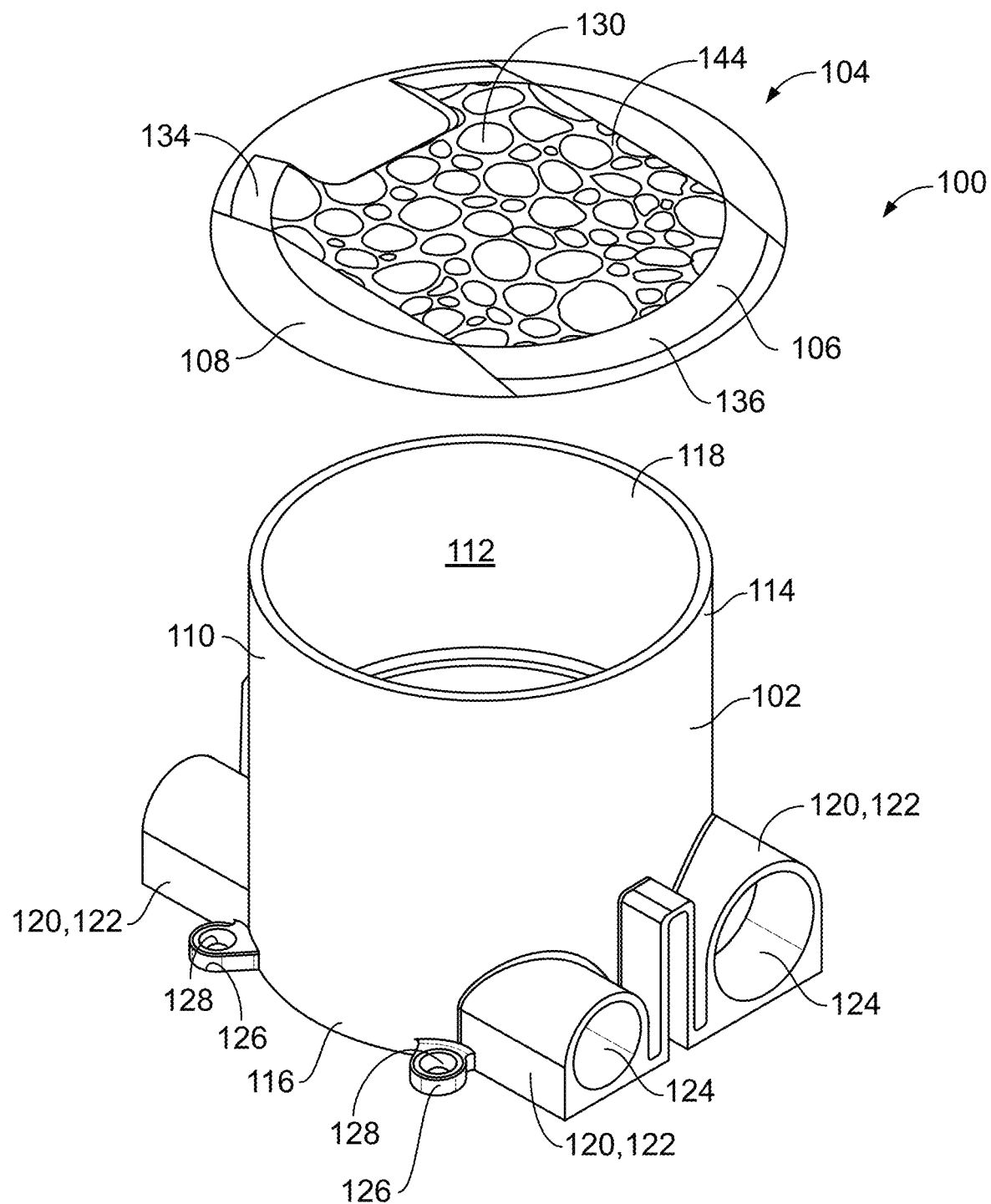
FIG. 1 illustrates a partially exploded view of a floor box assembly according to an embodiment of the present application.

The foregoing summary, as well as the following detailed description of certain embodiments of the present application, will be better understood when read in conjunction with the appended drawings. For the purpose of illustrating the application, there is shown in the drawings, certain embodiments. It should be understood, however, that the present application is not limited to the arrangements and instrumentalities shown in the attached drawings. Further, like numbers in the respective figures indicate like or comparable parts.

DESCRIPTION OF THE ILLUSTRATED EMBODIMENTS

Certain terminology is used in the foregoing description for convenience and is not intended to be limiting. Words such as "upper," "lower," "top," "bottom," "first," and "second" designate directions in the drawings to which reference is made. This terminology includes the words specifically noted above, derivatives thereof, and words of similar import. Additionally, the words "a" and "one" are defined as including one or more of the referenced item unless specifically noted. The phrase "at least one of" followed by a list of two or more items, such as "A, B or C," means any individual one of A, B or C, as well as any combination thereof.

FIG. 1 illustrates a partially exploded view of a floor box assembly 100 according to an embodiment of the present application. The floor box assembly 100 can include a floor box 102 and a floor cover assembly 104, the floor cover assembly 104 including a lid 106 and a base ring 108. As discussed below, the lid 106 can be selectively removable from the base ring 108. Further, the base ring 108 can be adapted for mating engagement with at least a portion of the floor box 102.

The floor box 102 can be constructed from a variety of different materials, including, for example, metallic and non-metallic materials, as well as a combination thereof. For example, according to certain embodiments, the floor box 102 can be constructed from one or more of a stamped steel, cast iron, plastics, brass, black coated metal, and polyvinyl chloride (PVC), among other materials. The floor box 102 includes a sidewall 110 and a base wall (not shown) that generally define an interior region 112 of the floor box 102. The sidewall 110 can include opposing upper and lower portions 114, 116, and can have a variety of shapes and configurations, including, for example, a generally cylindrical configuration, as shown in FIG. 1, among other configurations. The base wall can be connected to the lower portion 116 of the sidewall 110, and can at least partially extend between opposing portions of the sidewall 110. Further, the upper portion 114 of the sidewall 110 may generally define an opening 118 of the interior region 112.

The floor box 102 can be configured to house one or more data ports and/or electrical devices in the interior region 112 and/or at or around the opening 118 of the interior region 112. For example, according to certain embodiments, the floor box 102 can be configured to house one or more outlets that may extend though the opening 118. Additionally, or optionally, the floor box 102 can also be configured to accommodate the passage and/or coupling of power and transmission cables and wires that extend into and/or through the floor box 102.

According to certain embodiments, the floor box 102 can also include one or more fittings or ports 120 that extend from, or are adjoined to, a portion of the lower portion 116 of the sidewall 110. Each fitting 120 can include a fitting wall 122 that generally defines a passageway 124 for the associated fitting 120 that extends through the fitting wall 122 and to the interior region 112 of the floor box 102. Thus, the passageway 124 of each fitting 120 can provide a pathway for the ingress/egress of wire or cables into/from/through the floor box 102. Additionally, or alternatively, at least certain floor boxes 102 can include knockouts, which may comprise partially cut or partially stamped regions in the sidewall 110 or base wall that can be selectively removed so as to provide an opening or aperture in the associated sidewall 110 or base wall. Such openings or apertures in the sidewall 110 or base wall can be provided by removal of the knockout(s), thereby accommodating the ingress/egress of wire or cables into/from/through the resulting aperture(s) in the floor box 102, and moreover, the interior region 112 of the floor box 102.

As also shown in FIG. 1, the floor box 102 can include a plurality of anchors or feet 126 that can extend outwardly from the lower portion 116 of the sidewall 110 of the floor box 102. As shown, according to the illustrated embodiment, the anchors 126 can outwardly extend in different directions. Additionally, the anchors 126 can include an orifice 128 that is configured to receive a mechanical fastener, such as, for example, a bolt, screw, or pin, among other fasteners that can facilitate mounting of the floor box 102, and thus the floor box assembly 100.

Figure 2:
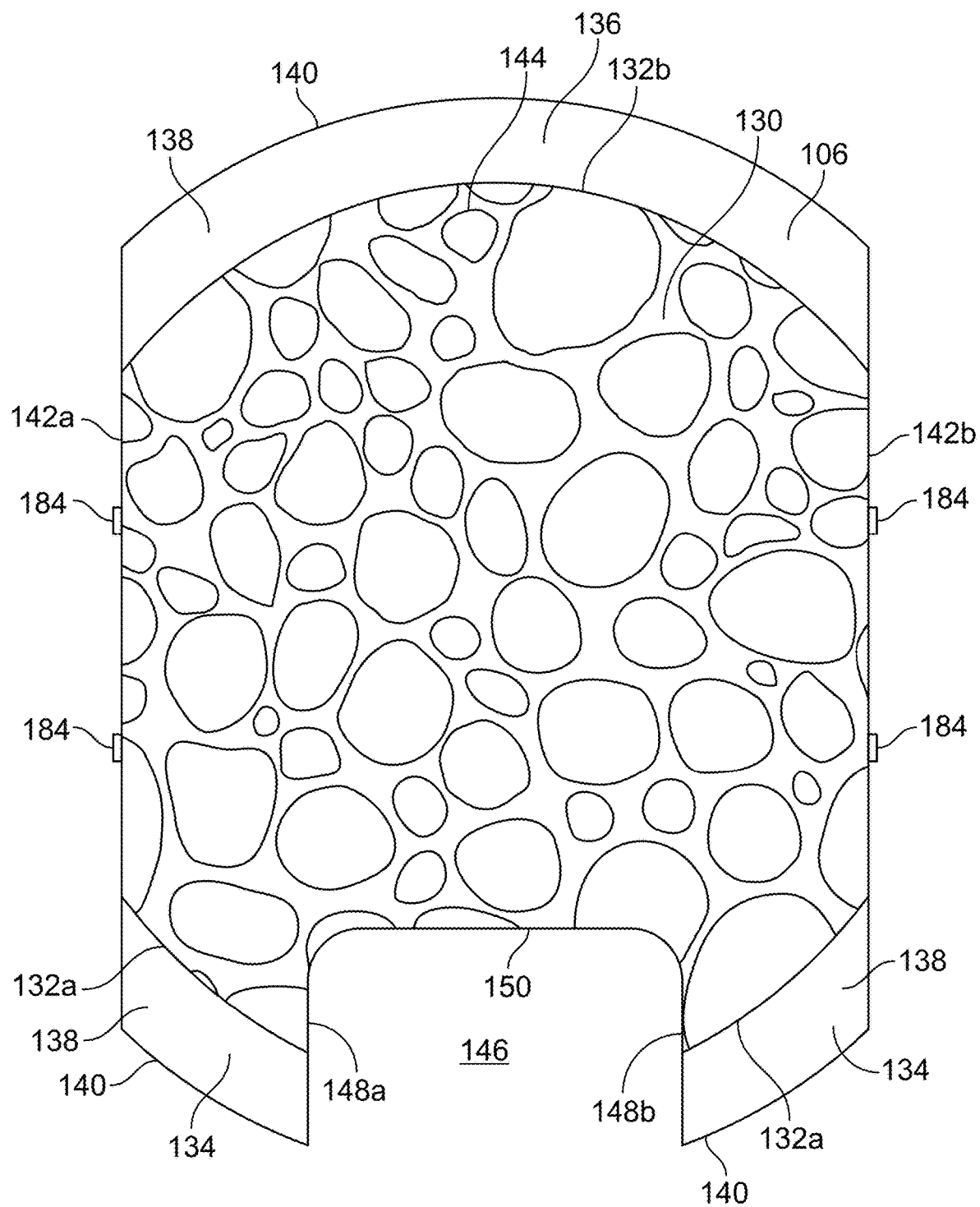
FIG. 2 illustrates a top side view of an exemplary lid for a floor cover assembly according to an embodiment of the present application.

FIGS. 2 and 3 illustrate top and side views, respectively, of an exemplary lid 106 for a floor cover assembly 104 according to an embodiment of the present application. The lid 106 can have a variety of shapes and configurations. Further the lid 106 can be configured such that, when the floor cover assembly 104 is coupled to the floor box 102, a lid cover 130 of the lid 106 extends over, or covers, at least a portion of the opening 118, and thus a portion of the interior region 112, of the floor box 102. According to certain embodiments, opposing front and back edges 132a, 132b of the lid cover 130 can be adjoined to a front rim 134 and a back rim 136, respectively, of the lid 106. As seen in at least FIG. 3, according to certain embodiments, an upper surface 138 of the front and back rims 134, 136 can have a downward slope or taper from, or around, the front and back edges 132a, 132b, respectively, of the lid cover 130 to a corresponding outer edge 140 of the front and back rims 134, 136.

The lid 106 can also include a pair of opposing sidewalls 142a, 142b (referred to collectively as sidewall 142) that extend along the length of the lid 106, and which are generally parallel to each other. Thus, as seen in FIG. 2, a first sidewall 142a can extend along a first side of the lid 106 from the outer edge 140 of the front rim 134 to the outer edge 140 of the rear rim 136, while a second sidewall 142b can extend along another, second side of the lid 106 from the outer edge 140 of the front rim 134 to the outer edge 140 of the rear rim 136. A portion of each of the opposing sidewalls 142a, 142b can thus also generally define opposing side edges of the lid cover 130.

Figure 15:
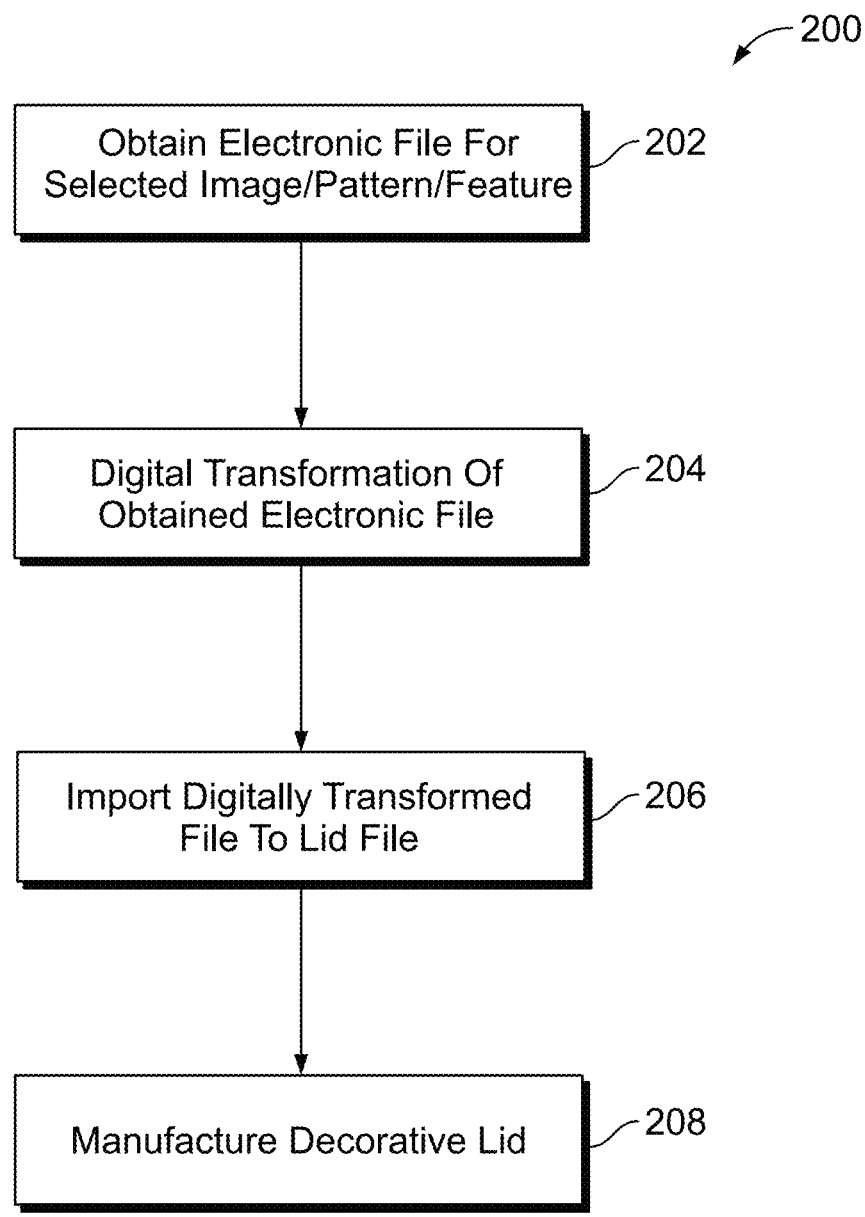
FIG. 15 illustrates a flow chart for an exemplary process for forming a lid of a floor cover assembly according to an illustrated embodiment of the subject application.

The lid 106, as well as the base ring 108, can be manufactured using a variety of processes, and in particular, by use of processes that can accommodate customization in manner that, with respect to low-volume production, can be economically feasible. For example, FIG. 15 illustrates a flow chart for an exemplary process 200 for forming a lid 106 of a floor cover assembly 104 according to an illustrated embodiment of the subject application. The operations illustrated are understood to be examples only, and operations may be combined or divided, and added or removed, as well as re-ordered in whole or in part, unless explicitly stated to the contrary. At step 202, an electronic file can be attained for a selected image(s), pattern(s), and/or ornamental features that are to be seen on at least a top side 144 of the lid cover 130. A variety of types of electronic files can be used, including, for example, electronic image files such as JPEG, TIFF, GIF, and/or PNG, among other types of electronic files that can include a selected image(s). The image(s) contained in the electronic file can, according to certain embodiments, be two-dimensional or three-dimensional image(s). If the image(s) in the electronic file is/are two-dimensional image(s), such as, for example, a two dimensional image of a collection of pebbles, then at step 204, the image can undergo digital transformation that can transform the image(s) into three-dimensions.

At step 206, the image of the features for the lid cover 130, such as, for example, a three-dimensional image of the peddles attained at step 202 and/or step 204, can be imported into a file or program that can conform such features to the boundaries, constraints, and/or characteristics relating to a geometric shape(s) for the lid 106, including, for example a file containing dimensions and features of a lid 106 that has a UL approved or listed geometry. For example, the file for the features of the lid cover 130 obtained at step 202 or step 204 can be imported or otherwise used in step 206 in connection with a file(s) that contains the other geometric features for the lid 106 so as to provide an electronic production file that can form the lid 106 with the ornamental three-dimensional features of the lid cover 130, such as, for example, the peddle features on the lid cover 130 seen in at least FIGS. 1 and 2. Alternatively, the production file obtained at step 206 can provide production information for producing the three-dimensional ornamental features of the lid cover 130 on an existing, or pre-manufactured, lid 106. Thus, the type of file provided at step 206 can depend on a variety of criteria, including, for example, the process used to manufacture the lid 106 and/or the ornamental features for the lid cover 130 at step 208.

A variety of different types of manufacturing processes can be used to manufacture the ornamental features of the lid cover 130 and/or the entire lid 106 at step 208. For example, according to certain embodiments, at step 208 the lid 106, including the three-dimensional ornamental features of the lid cover 130, can be constructed via an additive manufacturing process, such as, for example three-dimensional printing, including, but not limited to, direct energy disposition, powder bed fusion and/or binder jetting. Alternatively, according to other embodiments, the manufacturing process at step 208 can involve forming the three-dimensional ornamental features for the lid cover 130 on an existing lid 106, for example, on a lid 106 that was previously manufacturing using die-casting techniques. Such forming of the ornamental lid cover 130 features on an existing lid 106 can be accomplished in a variety of different manners, including, for example, via direct energy deposition techniques, including, but not limited to wire arc welding the ornamental features onto the existing or pre-manufactured lid cover 130 and/or lid 106.

The lid 106 can also include a slot or opening 146 that extends through at least a portion of the lid cover 130. According to the illustrated embodiment, the slot 146 extends through one of the front and back rims 134, 136 so as to create a void or open area in, and through, the lid 106. For example, in the illustrated embodiment, a pair of side slot walls 148a, 148b inwardly extend from the outer edge 140 of the front rim 134 and into a portion of the lid cover 130, the side slot walls 148a, 148b being connected by a back slot wall 150 that extends along a portion of the lid cover 130 between the side slot walls 148a, 148b. Further, as shown in FIG. 2, according to certain embodiments, the side slot walls 148a, 148b can be generally parallel to each other, and generally orthogonal to the back slot wall 150. Further, the side slot walls 148a, 148b and the back slot wall 150 can generally define the open area provided by the slot 146. Additionally, the side slot walls 148a, 148b can extend a distance into the lid cover 130 toward the rear rim 136 such that at least a portion of the slot 146 is positioned above the opening 118, and thus the interior region 112, of the floor box 102 when the floor cover assembly 104 is coupled to the floor box 102. Such a configuration of the slot 146, including the length of the back slot wall 150 between the side slot walls 148a, 148b, can be structured to accommodate the passage of cables and/or wires into/from the interior region 112 and opening 118 of the floor box 102, as well as through the floor cover assembly 104.

According to certain embodiments, the lid cover 130 can be selectively displaceable relative to the remainder of the lid 106. For example, according to the certain embodiments, the lid cover 130 can be pivotally coupled to the lid 106 by a hinge such that the lid cover 130 can be pivotally displaced from a closed position at which the lid cover 130 covers at least a portion of opening 118 of the interior region 112 of the floor box 102 so as to prevent ingress/egress into/from the interior region 112 (FIG. 1), to an open position at which the lid cover 130 is pivoted generally away from the floor box 102 to a position at which the lid cover 130 does not extend, or extends over a smaller portion of, the opening 118 of the interior region 112.

As seen in at least FIGS. 3-6, according to certain embodiments, the floor cover assembly 104 can include a gasket 152 that is positioned to abut at least a portion of a bottom surface 154 of the lid 106, the bottom surface 154 of the lid 106 and the top side 144 of the lid cover 130 being on opposing sides of the lid 106. Moreover, the gasket 152 is configured to be at least partially compressed between the lid 106 and the base ring 108 so as to provide a generally liquid tight seal therebetween. Accordingly, the gasket 152 can be constructed from a variety of different types of materials, including, for example, rubber, silicone, cork, polytetrafluoroethylene, plastic, and/or a combination thereof, among other materials. Further, the material of the gasket 152, and/or the size, shape, and/or configuration of the gasket 152, can provide the gasket 152 with a degree of resiliency against the compressive forces asserted against the gasket 152 when the gasket 152 is compressed between the lid 106 and the base ring 108. Further, the gasket 152 can have a shape that prevents the gasket 152 from interfering with ability of cables and wires to pass into/though the interior region 112 of the floor box 102 via the slot 146 in the lid 106. More specifically, the gasket 152 can be shaped and sized so that the gasket 152 does not extend into the open area provided by the slot 146 in the lid 106.

Figure 7:
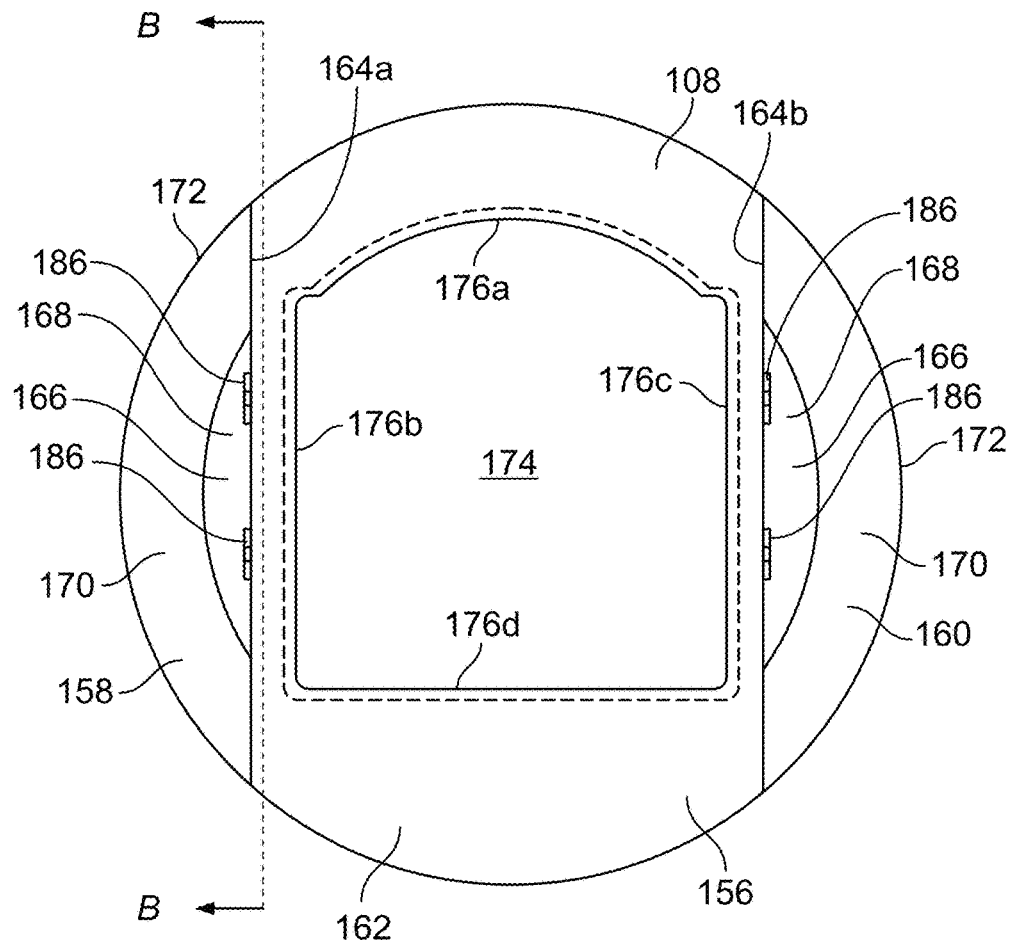
FIG. 7 illustrates a top side view of an exemplary ring base for a floor cover assembly according to an embodiment of the present application.
Figure 8:
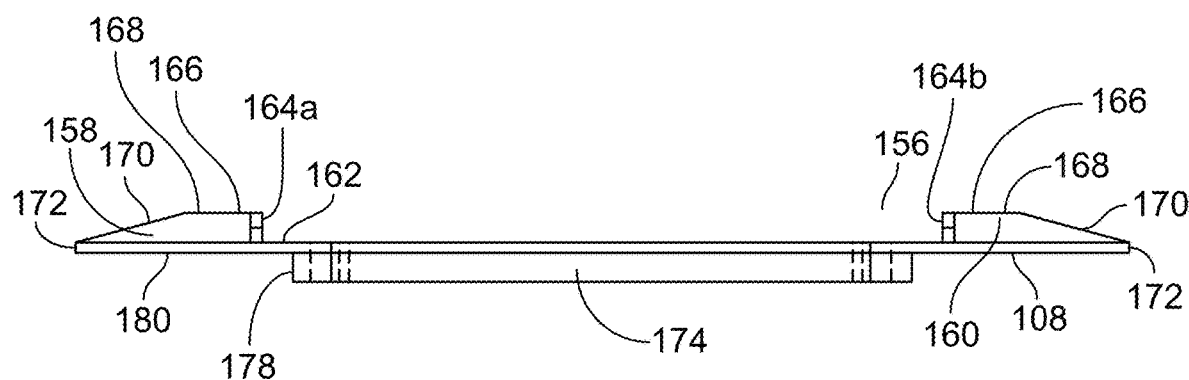
Figure 12:
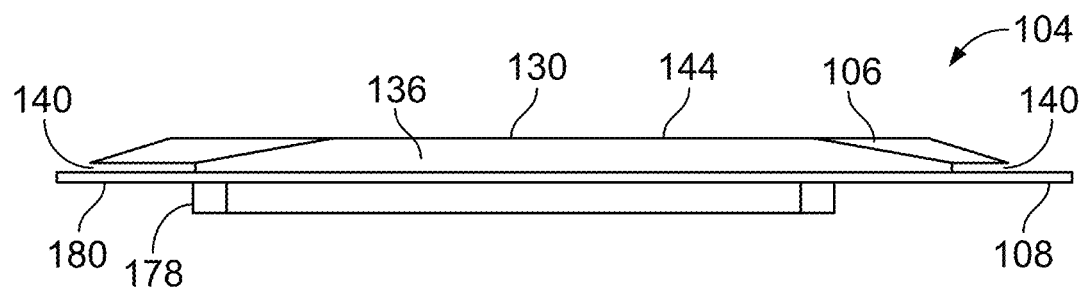

FIGS. 7 and 8 illustrate top and back side views, respectively, of an exemplary base ring 108 for a floor cover assembly 104 according to an embodiment of the present application. As seen, the base ring 108 includes a slotted portion 156 positioned between a first side rim 158 and a second side rim 160. The slotted portion 156 can be a recessed portion of the base ring 108 that is configured to receive placement of the lid 106. According to the illustrated embodiment, the slotted portion 156 has an upper slot wall 162 that is positioned to be adjacent to, and/or abut, a lower surface of the gasket 152 and/or a bottom surface 154 of the lid 106. Additionally, the slotted portion 156 can be bordered by opposing sidewalls 164a, 164b (collectively sidewall 164) of the first and second side rims 158, 160. The opposing sidewalls 164a, 164b of the slotted portion 156 can be spaced apart by a width that is similar to, if not slightly larger, than the width between the sidewalls 142a, 142b of the lid 106. Additionally, the slotted portion 156 can have a depth, such as, for example, a depth from an adjacent portion of the first side rim 158 and a second side rim 160 such that, when the floor cover assembly 104 is assembled, the top side 144 of the lid cover 130 is generally flush or level with the adjacent portion of the upper surface 166 of the first side rim 158 and second side rim 160, as seen for example, in at least FIGS. 1 and 12.

The first and second side rims 158, 160 can include an upper surface 166 having a first segment 168 and a second segment 170. The first segment 168 can be generally level, and aligned with, the top side 144 of the lid cover 130. The second segment 170 can extend from the first segment 168, and can have a configuration that is similar to the configuration of the front rim 134 and the rear rim 136 of the lid 106. Thus, as seen in at least FIG. 8, according to certain embodiments, the second segment 170 can have a downward slope or taper from the first segment 168 to a side edge 170 of the associated first or second side rim 158, 160 that is similar to the slope or taper of the upper surface 138 of the front and back rims 134, 136. Further, the first and second side rims 158, 160 can be positioned such that when the lid 106 is secured in the slotted portion 156 of the base ring 108, the first and second side rims 158, 160 and at least the rear rim 136 can provide at least the appearance of a generally continuous rim around at least a portion of the floor cover assembly 104 with certain exceptions, such as, for example, locations at which the slot 146 extends through the front rim 134. Further, as seen in at least FIG. 11, according to certain embodiments, the side edge 172 can be positioned further outwardly than the outer edge 140 of the front and back rims 134, 136.

Figure 11:
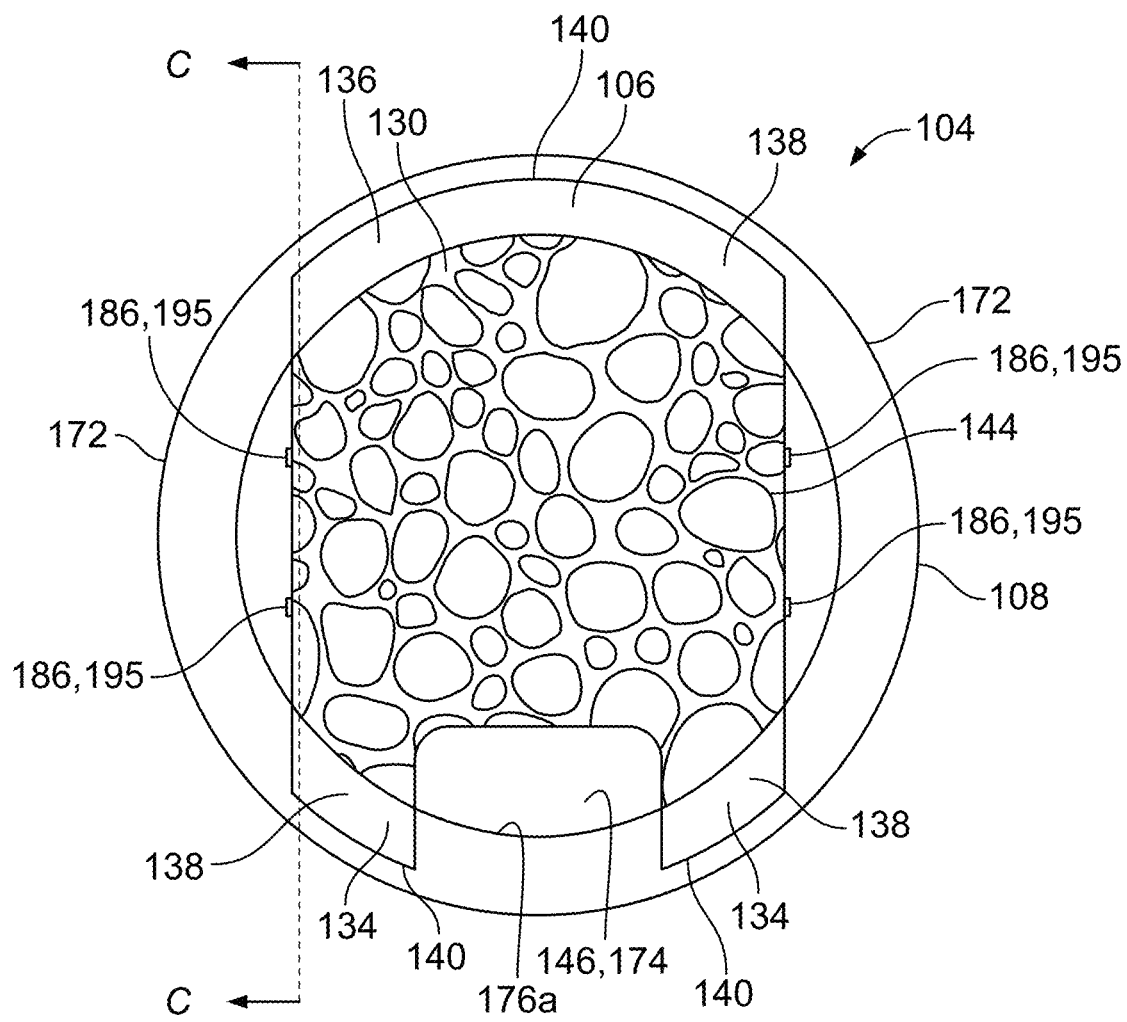
FIGS. 11 and 12 illustrate top and side views of an exemplary floor cover assembly according to an embodiment of the present application.

The base ring 108 can include an opening 174 that extends through the base ring 108, and which is generally in a central location of the base ring 108. Additionally, the opening 174 can be generally defined by a plurality of walls 176a-d. The plurality of walls 176a-d can include opposing first and second sidewalls 176b, 176c that are generally parallel to each other, and which, at opposing ends, are generally joined by a front wall 176a and a back wall 176d. According to the illustrated embodiment, the back wall 176d is generally orthogonal to the first and second sidewalls 176b, 176c, while the front wall 176a has an arcuate shape that extends outwardly so as to increase the size of the opening 174. Moreover, the front wall 176a is sized and shaped to extend the opening 174 of the base ring 108 at least beneath a portion of the slot 146 of the lid 106 when the lid 106 is coupled to the base ring 108 at a first orientation, as seen in FIG. 11. Thus, when the lid 106 is coupled to the base ring 108 at a first orientation, and the floor cover assembly 104 is coupled to the floor box 102, at least portions of the open areas provided by the slot 146 of the lid 106, the opening 174 of the base ring 108 defined by at least the front wall 176a, and the opening 118 and interior region 112 of the floor box 102 can be aligned so as to accommodate passage of at least wires and cables therethrough.

The lid 106 can also be coupled to the base ring 108 at a second orientation that is opposite to the first orientation, such as, for example, an orientation that is about 180 degrees different than the first orientation while the top side 144 of the lid cover 130 remains positioned in an upward direction relative to the base ring 108. Therefore, when the lid 106 is coupled to the base ring at the second orientation, the slot 146 of the lid 106 is instead generally adjacent to the back wall 176d of the opening 174 of the base ring 108. However, unlike the front wall 176a of the opening, the back wall 176d may not be configured to extend the size of the opening 174 in the base ring 108. To the contrary, the back wall 176d can be configured such that, when the lid 106 is coupled to the base ring 108, the back wall 176d does not extend within or beyond the slot 146 of the lid 106. Thus, as seen in FIG. 1, when the lid 106 is at the second orientation, the slot 146 may not be positioned over the opening 174 of the base ring 108, and therefore the slot 146 may not be in fluid communication with the opening 118 and interior region 112 of the floor box 102, but instead extends over a portion of material along the slotted portion of the base ring 108. Thus, when the lid 106 is at a the second orientation relative to the base ring 108, the floor cover assembly 104 can be in a closed configuration that prevents ingress/egress through the opening 118 of the interior region 112 of the floor box 102.

As shown in at least FIG. 8, the base ring 108 can include a flange 178 that extends from a lower wall 180 of the base ring 108 and which can be secured about the upper portion 114 of the sidewall 110 of the floor box 102. According to certain embodiments, the flange 178 can have a size, such as, for example, a diameter, that is smaller or larger than a corresponding size of the sidewall 110 of the floor box 102, such that the flange 178 extends within, or over, the sidewall 110 of the floor box 102. Additionally, the opening 174 of the base ring 108 can extend through the flange 178 so that the opening 174 can be in fluid communication with the interior region 112 of the floor box 102.

As seen in at least FIGS. 2-6, 7, 9, 13, and 14, the floor cover assembly 104 can include a latch system 182 that can assist in securing the lid 106 to the base ring 108 at a position at which the lid 106 covers at least a portion of the opening 118 and interior region 112 of the floor box 102, as seen in FIG. 11. The latch system 182 can be configured to lockingly secure the lid 106 to the base ring 108 when the lid 106 is at either the first or second orientations of the lid 106 relative to the base ring 108, as previously discussed. Thus, the latch system 182 can accommodate the reversible orientation of the lid 106 relative to the base ring 108. According to certain embodiments, the latch system 182 is a slide-and-lock system comprising at least one locking tab 184 on one of the lid 106 and the base ring 108, and one or more mating lock grooves 186 in the other of the lid 106 and the base ring 108.

For example, according to the illustrated embodiment, each sidewall 142a, 142b of the lid 106 includes a plurality of locking tabs 184, and more specifically two locking tabs 184 that protrude, or overhang, from the associated sidewall 142a, 142b. Referencing FIG. 6, each locking tab 184 can have a face wall 188 that extends between first and second ends 190a, 190b of the locking tab 184. As seen in FIG. 5, the face wall 188 can be inwardly tapered or sloped as the face wall 188 extends between opposing top and bottoms walls 192a, 192b of the locking tab 184. Such a taper or slope can be configured to provide clearance that can minimize the potential that portions of the locking tab 184 may contact, and thus interfere with, surfaces or walls of the base ring 108 as the locking tab 184 is at least initially being received or placed within the mating lock groove 186. For example, the face wall 188 can be configured to prevent surfaces or edges of the locking tab 184 from contacting portions of the adjacent sidewall 164a, 164b of the slotted portion 156 of the base ring 108 or surfaces of the lock groove 186 in a manner that interfere with the locking tab 184 being operably positioned within the lock groove 186. Such a configuration can also include the sloped face wall 188 being adjoined to the top wall 192a of the locking tab 184 by a rounded or chamfered transition wall 194, rather than intersecting the top wall 192a at an outwardly projecting edge that could otherwise possibly contribute to potential interference with the locking tab 184 being received in the lock groove 186.

According to the illustrated embodiment, the base ring 108 comprises four lock grooves 186 that each can mate with a locking tab 184 of the lid 106, both when the lid 106 is in the first or second orientations relative to the base ring 108. According to such an embodiment, the lock grooves 186 extend into the sidewalls 164a, 164b of the slotted portion 156. As seen in at least FIGS. 9, 10, and 14, each lock groove 186 can comprise a plurality of walls 196a-g that define a first channel 197, a second channel 198, and an interconnecting connection channel 199. The first channel 197 can include a first, open end 195 that extends through an upper surface 166 of the associated base ring 108 or lid 106 to a second end 193 of the first channel 197. The first, open end 195 is positioned to receive insertion of the locking tab 184 into the lock groove 186. According to the illustrated embodiment, the first, open end 195 of the first channel 197 is positioned in the first segment 168 of the upper surface 166 of the associated first or second side rim 158, 160. Additionally, the first channel 197 extends along walls 196a, 196b that extend in at least in a downward direction from the first segment 168 of the upper surface 166 and toward the lower wall 180 of the base ring 108. As seen in at least FIG. 10, the walls 196a, 196b, and thus the first channel 197, can extend in a downward direction that is generally orthogonal to the first segment 168 of the upper surface 166 or the lower wall 180. Alternatively, the walls 196a, 196b, and thus the first channel 197, can be downwardly sloped, such that the first channel 197 is both non-parallel, and non-perpendicular to the first segment 168 of the upper surface 166 and/or the lower wall 180. The second end 193 of the first channel 197 of the lock groove 186 is positioned at a depth within the base ring 108 such that, when a mating locking tab 184 is at the second end 193, the top wall 192a of the locking tab 184 is recessed below at least the portion of the upper surface 166 of the first or second side rim 158, 160 that is positioned about the first, open end 195 of the first channel 197.

The connection channel 199, which is adjoined to the second end 193 of the first channel 197, can extend along walls 196c, 196d in a direction that is different than the direction of the first channel 197. For example, according to the illustrated embodiment, the connection channel 199 and associated walls 196c, 196d can extend in a direction that is generally orthogonal to the first channel 197 and associated walls 196a, 196b, and/or in a direction that is parallel to at least the lower wall 180 of the base ring 108. Moreover, while the first channel 197 extends in a direction that can accommodate at least vertical displacement of the locking tab 184, the connection channel 199 can extend in a direction that can alter a horizontal position of the locking tab 184. Further, the connection channel 199 can be positioned at a recessed location within the base ring 108 such that the locking tab 184, when positioned in the connection channel 199, is beneath, or does not extend to or protrude above, at least the upper surface 166 of the associated first or second side rim 158, 160.

The connection channel 199 can extend a length away from the first channel 197 to the second channel 198, which can be generally defined by a plurality of the walls 196e, 196f, 196g. The second channel 198 can extend in an generally upwardly direction, such as, for example, in a vertical direction toward the upper surface 166 of the associated first and second side rim 158, 160, to an upper wall 196f of the second channel 198. The upper wall 196f of the second channel 198 can be at a vertical height that is vertically offset from, and moreover slightly higher, than the upper wall 196c of the connection channel 199. Such offset in heights can result in, when the locking tab 184 is at the upper end 191 of the second channel 198, only a portion of the locking tab 184 being at a vertical height that is higher than the upper wall 196c of the connection channel 199, as seen in FIG. 14. Moreover, such an offset in heights between the upper walls 196f, 196c of the second channel 198 and the connection channel 199, respectively, can result in the second channel 198 having a wall 196e that extends from the upper wall 196c of the connection channel 199 to the upper wall 196f of the second channel 198. This wall 196e of the second channel 198 can thus, when at locking tab 184 is at the upper end 191 of the second channel 198, at least assist in preventing the locking tab 184 from being horizontally displaced along the connection channel 199, thereby locking the locking tab 184 within the lock groove 186.

Accordingly, during assembly of the lid 106 to the base ring 108 in either the first or second orientation of the lid 106, the lid 106 can be at least initially positioned over at least a portion of the base ring 108 such that each locking tab 184 is positioned to be received within the first channel 197 of a lock groove 186. According to the illustrated embodiment, the gasket 152 can be sized such that the locking tab 184 may sit in the first channel 197 at a position above the second end 193 of the first channel 197. Therefore, a user may apply a generally downward force against the lid 106 that can compress the gasket 152 between the lid 106 and the base ring 108 such that the locking tab 184 can be displaced along the first channel 197 to the second end 193 of the first channel 197. When the locking tab 184 is at the second end 193 of the first channel 197, and with the downwardly force continuing to compress the gasket 152, the lid 106 can be slid in a horizontal direction such that the locking tab 184 is displaced along the connection channel 199 until reaching the second channel 198. Such horizontal sliding of the locking tab 184 can coincide with at least a degree of sliding of the lid 106 within the slotted portion 156 of the base ring 108. With the locking tab 184 at the second channel 198, the user can release the downward force against the lid 106 that had been used to compress the gasket 152 as the locking tab 184 was being displaced by the user along the first channel 197 and connection channel 199 of the lock groove 186. The resiliency and configuration of the gasket 152 can, upon release of the user force against the lid 106, result in the gasket 152 at least partially returning to a size that upwardly pushes the lid 106 and/or locking tab 184 such that the locking tab 184 is displaced upwardly along the second channel 198 to abut, or be adjacent to, the upper wall 196f of the second channel 198. With the locking tab 184 abutting, or adjacent to, the upper wall 196f of the second channel 198, the locking tab 184 can be at a vertical height in the second channel 198 at which the wall 196e of the second channel 198 can prevent the locking tab 184 from being horizontally displaced along the connection channel 199 back to the first channel 197, and the lid 106 can thus be lockingly secured to the base ring 108. Further, the resiliency and size of the gasket 152 can continue to provide a force against the lid 106 and/or the locking tab 184 that can assist in retaining the locking tab 184 at such a locked position within the second channel 198.

In the event the locking engagement of the lid 106 to the base ring 108 is to be removed, the user can exert a downward force against the lid 106 so as to further compress the gasket 152. Such force and compression of the gasket 152 can allow the locking tab 184 to be vertically displaced along the second channel 198 from the locked position to a position at which the locking tab 184 is generally aligned with the connection channel 199. The user can then slide the lid 106 along the slotted portion 156 of the base ring 108 such that the locking tab 184 is horizontally slid along the connection channel 199 to the first channel 197. With the locking tab 184 in the first channel 197, the lid 106 can be vertically raised such that the locking tab 184 can exist the lock groove 186, and the lid 106 can then be removed from the base ring 108.

While the invention has been described in connection with what is presently considered to be the most practical and preferred embodiment, it is to be understood that the invention is not to be limited to the disclosed embodiment(s), but on the contrary, is intended to cover various modifications and equivalent arrangements included within the spirit and scope of the appended claims, which scope is to be accorded the broadest interpretation so as to encompass all such modifications and equivalent structures as permitted under the law. Furthermore it should be understood that while the use of the word preferable, preferably, or preferred in the description above indicates that feature so described may be more desirable, it nonetheless may not be necessary and any embodiment lacking the same may be contemplated as within the scope of the invention, that scope being defined by the claims that follow. In reading the claims it is intended that when words such as "a," "an," "at least one" and "at least a portion" are used, there is no intention to limit the claim to only one item unless specifically stated to the contrary in the claim. Further, when the language "at least a portion" and/or "a portion" is used the item may include a portion and/or the entire item unless specifically stated to the contrary.

The invention claimed is:

1. An apparatus comprising:
    a lid; and
    a base ring having a pair of sidewalls and an upper slotted wall that define at least a portion of a slotted portion of the base ring, the lid being sized for at least partial slideable displacement within the slotted portion of the base ring, a portion of the upper slotted wall including an opening that extends through the base ring;
    wherein the lid or the base ring include a plurality of locking tabs, and the other of the lid and the base ring include a plurality of lock grooves, the plurality of locking tabs each comprising an overhang that is sized to be received in an open end of a mating lock groove of the plurality of lock grooves, the plurality of lock grooves shaped to accommodate displacement of the plurality of locking tabs within the mating lock groove in at least two different directions from the open end to a locked position within the mating lock groove;
    wherein the plurality of lock grooves each comprise a first channel, a second channel, and a connection channel, the connection channel being positioned between, and extending in a different direction than, the first and second channels.

2. The apparatus of claim 1, wherein the plurality of locking tabs and the plurality of lock grooves are positioned and configured to accommodate displacement of the plurality of locking tabs from the open end to the locked position when the lid is at a first orientation and at a second orientation relative to the base ring, the first orientation being different than the second orientation.

3. The apparatus of claim 2, wherein the lid includes a slot, the slot positioned to extend over a portion of the opening in the upper slotted wall when the lid is at the first orientation and not extend over the opening in the upper slotted wall when the lid is at the second orientation.

4. The apparatus of claim 1, wherein the second channel extends to a vertical height than is higher than a vertical height of an adjacent portion of the connection channel.

5. The apparatus of claim 1, wherein the locking tabs include a top wall, a bottom wall, and a face wall, the face wall sloping downwardly and inwardly from the top wall to the bottom wall.

6. The apparatus of claim 1, wherein the lid includes a lid cover having a three-dimensional image that extends between a front edge and a back edge of the lid cover, the front edge and the back edge being at opposing sides of the lid cover.

7. The apparatus of claim 6, wherein the three-dimensional image is a pattern that extends from the front edge to the back edge of the lid cover.

8. The apparatus of claim 6, wherein the lid further includes a front rim and a back rim, the front rim extending from the front edge of the lid cover to a portion of an edge of the lid, the back rim extending from the back edge of the lid cover to another portion of the edge of the lid.

9. The apparatus of claim 8, wherein at least a portion of both the front rim and the back rim are downwardly sloped, and wherein the plurality of lock grooves are shaped to accommodate displacement of the plurality of locking tabs within the mating lock groove in three directions.

10. The apparatus of claim 6, wherein the lid includes a slot that extends from an outer edge of the lid into a portion of the lid cover, the slot sized to extend over a portion of the opening when the lid is lockingly secured to the base ring at a first orientation, the opening shaped to not extend beneath the slot when the lid is lockingly secured to the base ring at a second orientation, the second orientation being different than the first orientation.

11. The apparatus of claim 1, further including a floor box structured to be coupled to the base ring.

12. An apparatus comprising:
    a lid having a first sidewall and a second sidewall that extend between opposing outer edges of the lid, at least one locking tab outwardly projecting from each of the first and second sidewalls of the lid, the lid further including a slot that extends from a front edge portion of the outer edges of the lid and into a lid cover of the lid, the slot providing an open area through the lid;
    a base ring having a first sidewall, a second sidewall, and an upper slot wall that define at least a portion of a slotted portion of the base ring, the slotted portion sized to receive placement of the lid, a portion of the upper slotted wall including an opening that extends through the base ring, at least one lock groove positioned in each of the first and second sidewalls of the base ring, the at least one lock groove having an open end sized to receive insertion of the at least one locking tab, the at least one lock groove shaped to accommodate displacement of the at least one locking tab within the at least one lock groove in at least three different directions from the open end to a locked position within the at least one lock groove;
    and a gasket configured to provide a seal between at least a portion of the lid and at least a portion of the base ring at least when the at least one locking tab is at the locked position within the at least one lock groove;
    wherein the base ring further includes a flange sized for coupling to a floor box;
    wherein a top surface of the lid cover comprises a three-dimensional image that extends between a front edge and a back edge of the lid cover, the front edge and the back edge being at opposing sides of the lid cover.

13. The apparatus of claim 12, wherein the at least one locking tab and the at least one lock groove are positioned and configured to accommodate displacement of the at least one locking tab from the open end to the locked position when the lid is at a first orientation and at a second orientation relative to the base ring, the first orientation being different than the second orientation.

14. The apparatus of claim 13, wherein the slot is positioned to extend over a portion of the opening in the upper slotted wall when the lid is at the first orientation and not extend over the opening in the upper slotted wall when the lid is at the second orientation.

15. A method of manufacturing at least the lid cover for the lid of claim 12, the method comprising:
 obtaining an image in an electronic file;
 digitally transforming, if the image in the electronic file is a two-dimensional image, the two-dimensional image into a three-dimensional image;
 conforming the three-dimensional image to one or more geometric features of the lid cover to provide an assembly file; and
 manufacturing the lid cover using the assembly file to produce the lid cover with a three-dimensional representation of the three-dimensional image.

16. The method of claim 15, wherein the step of manufacturing the lid cover comprises manufacturing the lid cover with the manufacturing of the lid utilizing an additive manufacturing process.

17. The method of claim 15, wherein the step of manufacturing the lid cover comprises producing the three-dimensional representation of the three-dimensional image for the lid cover on the lid using a direct energy deposition process.

* * * * *